United States Patent
Perera et al.

(10) Patent No.: US 9,318,568 B2
(45) Date of Patent: Apr. 19, 2016

(54) INTEGRATION OF A NON-VOLATILE MEMORY (NVM) CELL AND A LOGIC TRANSISTOR AND METHOD THEREFOR

(71) Applicants: Asanga H. Perera, Austin, TX (US); Sung-Taeg Kang, Austin, TX (US)

(72) Inventors: Asanga H. Perera, Austin, TX (US); Sung-Taeg Kang, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/491,551

(22) Filed: Sep. 19, 2014

(65) Prior Publication Data

US 2016/0087058 A1    Mar. 24, 2016

(51) Int. Cl.
| | |
|---|---|
| H01L 29/76 | (2006.01) |
| H01L 29/423 | (2006.01) |
| H01L 27/115 | (2006.01) |
| H01L 21/3213 | (2006.01) |
| H01L 21/321 | (2006.01) |
| H01L 29/40 | (2006.01) |
| H01L 29/66 | (2006.01) |

(52) U.S. Cl.
CPC ...... *H01L 29/42348* (2013.01); *H01L 21/3212* (2013.01); *H01L 21/32134* (2013.01); *H01L 21/32139* (2013.01); *H01L 27/1157* (2013.01); *H01L 27/11573* (2013.01); *H01L 29/401* (2013.01); *H01L 29/42372* (2013.01); *H01L 29/665* (2013.01)

(58) Field of Classification Search
CPC .................. H01L 29/4232; H01L 29/4244
USPC .......................................... 257/314
See application file for complete search history.

(56) References Cited

U.S. PATENT DOCUMENTS

| | | | |
|---|---|---|---|
| 7,709,874 B2 * | 5/2010 | Okazaki | H01L 21/28282 257/295 |
| 2013/0171786 A1 * | 7/2013 | Shroff | H01L 21/28273 438/266 |
| 2013/0217197 A1 * | 8/2013 | Hall | H01L 29/66833 438/287 |
| 2013/0228878 A1 | 9/2013 | Wang et al. | |

OTHER PUBLICATIONS

Lee, S., "A Novel Self-Aligned 4-Bit SONOS-Type Nonvolatile Memory Cell With T-Gate and I-Shaped FinFET Structure", IEEE Transactions on Electron Devices, vol. 57, No. 8, Aug. 2010, pp. 1728-1736.

* cited by examiner

*Primary Examiner* — Reema Patel
*Assistant Examiner* — Syed Gheyas

(57) ABSTRACT

A method of making a semiconductor device includes forming a memory gate structure in a nonvolatile memory region of the semiconductor device, wherein the memory gate structure comprises a first gate separated from a second gate by a charge storage layer. A logic gate structure is formed in a logic region of the semiconductor device. A hard mask is formed over at least the metal electrode portion. The nonvolatile memory region is selectively etched such that a first recess is formed in the first gate and a second recess is formed in the second gate.

16 Claims, 6 Drawing Sheets

INTEGRATION OF A NON-VOLATILE MEMORY (NVM) CELL AND A LOGIC TRANSISTOR AND METHOD THEREFOR

BACKGROUND

1. Field

This disclosure relates generally to semiconductor manufacturing, and more specifically, to the integration of logic transistors and NVM cells.

2. Related Art

Non-volatile memories (NVMs) are often formed on an integrated circuit which also performs other functions. In such cases it is undesirable to sacrifice logic performance in favor of performance of the NVM. Also, it is important to avoid or minimize additional cost in achieving high performance for both the logic and the NVM. Gate last, which is a technique for enhancing performance by using a dummy gate on, typically, thermal oxide for the formation of source/drain regions and then replacing the dummy gate and thermal oxide with a higher performance gate or gate stack and gate dielectric has shown promise or by forming the higher performance gate dielectric relatively early in the process with the high performance gate or gate stack replacing a dummy gate formed over the higher performance gate dielectric. The higher performance gate will typically have higher conductance and an optimized work function. The higher performance gate dielectric will typically have a higher dielectric constant (k) than oxide.

Accordingly there is a need to provide further improvement in achieving high performance while also addressing cost increase issues in integrated circuits that have both NVM and logic, particularly in the context of gate last.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a step of chemical mechanical polishing useful in a gate last process for logic transistors can result in degraded isolation between a control gate and a select gate. This degradation is alleviated by recessing the control gate and the select gate relative to the charge storage layer that is between the select gate and the control gate. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
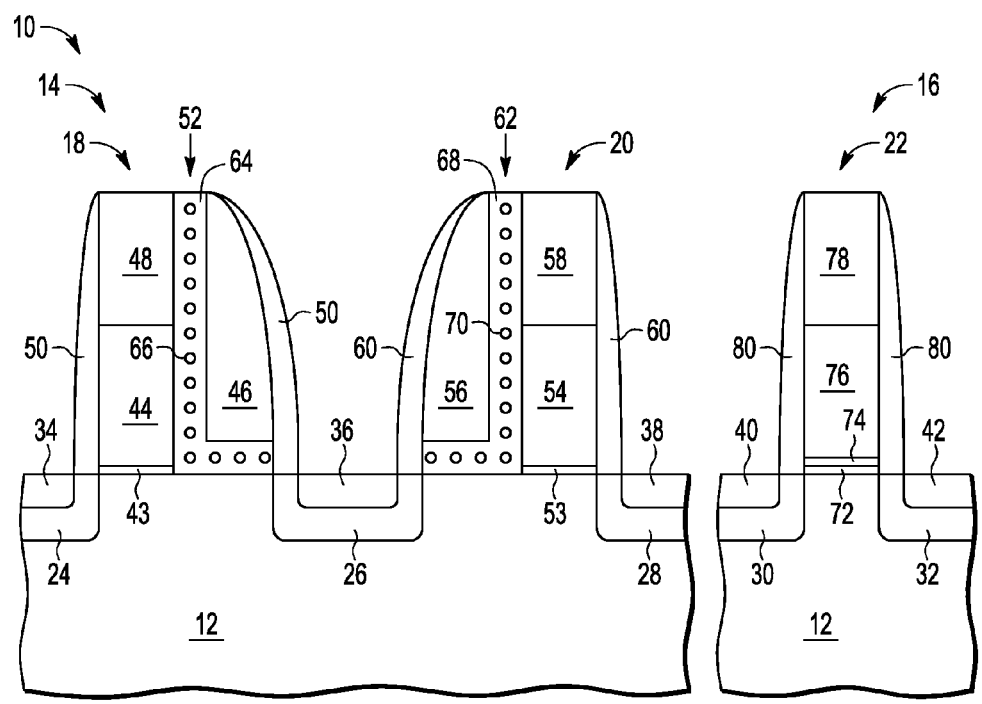
FIG. 1 is a cross section of a non-volatile memory cell and a gate last transistor at a stage in processing.

Shown in FIG. 1 is a semiconductor device 10 having an NVM region 14 and a logic region 16 with a substrate 12. NVM region 14 has gate structure 18 and a gate structure 20. Logic region 16 has a gate structure 22. In substrate 12 are source/drain regions 24, 26, and 28 in NVM region 14 and source/drain regions 30 and 32 in logic region 16. Silicide regions 34, 36, 38, 40, and 42 are in source/drain regions 24, 26, 28, 30, and 32, respectively. Gate structure 18 has a gate dielectric 43 on substrate 12, a select gate 44 on gate dielectric 43, a control gate 46, a cap dielectric 48 on select gate 44, a sidewall spacer 50 around select gate 44 and control gate 46, and a charge storage layer 52. In gate structure 18, sidewalls of select gate 44 and cap dielectric 48 are aligned. One aligned sidewall is separated from a sidewall of control gate 46 by charge storage layer 52. Charge storage layer 52 is also between substrate 12 and a bottom of control gate 46. Source/drain region 24 is on one side of gate structure 18 and source/drain region 26 is on the other side of gate structure 18. Gate structure 18 is a split gate structure for use in forming a split gate non-volatile memory (NVM) cell by being combined with source/drain regions 24 and 26. Gate structure 20 has a gate dielectric 53 on substrate 12, a select gate 54 on gate dielectric 53, a control gate 56, a cap dielectric 58 on select gate 54, a sidewall spacer 60 around select gate 54 and control gate 56, and a charge storage layer 62. In gate structure 20, sidewalls of select gate 54 and cap dielectric 58 are aligned. One aligned sidewall is separated from a sidewall of control gate 56 by charge storage layer 62. Charge storage layer 62 is also between substrate 12 and a bottom of control gate 56. Source/drain region 28 is on one side of gate structure 18 and source/drain region 26 is on the other side of gate structure 18. Gate structure 20 is a split gate structure for use in forming a split gate NVM cell by being combined with source/drain regions 28 and 26. The split gate NVM cells of gate structures 18 and 20 share source/drain region 26. Charge storage layer 52 has a plurality of nanocrystals, of which nanocrystal 66 is one, that are surrounded by an insulating layer that may be oxide. In this type of NVM cell structure, the read current is reversed from the program current so that the source/drain regions adjacent to gate structures 18 and 20 may function as either as sources or drains, depending on the particular operation being performed. Select gates 44 and 54 and control gates 46 and 56 may be polysilicon. Gate dielectric 43 may be a grown oxide that may be referenced as a thermal oxide. Gate structures 18 and 20 are representative of a split gate structure that can be used but other split gate structures can also be used. For example, there may be liners, other sidewall spacers, and control gates 46 and 56 may not extend much, if any, higher than select gates 44 and 54.

Gate structure 22 has a gate dielectric 72, which may be a high-k dielectric, on substrate 12; a barrier layer 74 on gate dielectric 72 that may contain a metal and may be, for example, titanium nitride; a dummy gate 76 that may be polysilicon on barrier layer 74; a cap dielectric 78, which may be nitride, aligned with dummy gate 76; and a sidewall spacer 80 around dummy gate 76 and cap dielectric 78. Source/drain regions 30 and 32 are on opposing sides of dummy gate 76. Select gates 44 and 54 are preferably the same height as logic gate 76. This can be achieved by forming them at the same time. It is also preferable for cap dielectrics 48, 58, and 78 to be the same height which can also be achieved by forming them at the same time. Cap dielectric 78 can be referenced a dummy portion.

Figure 2:
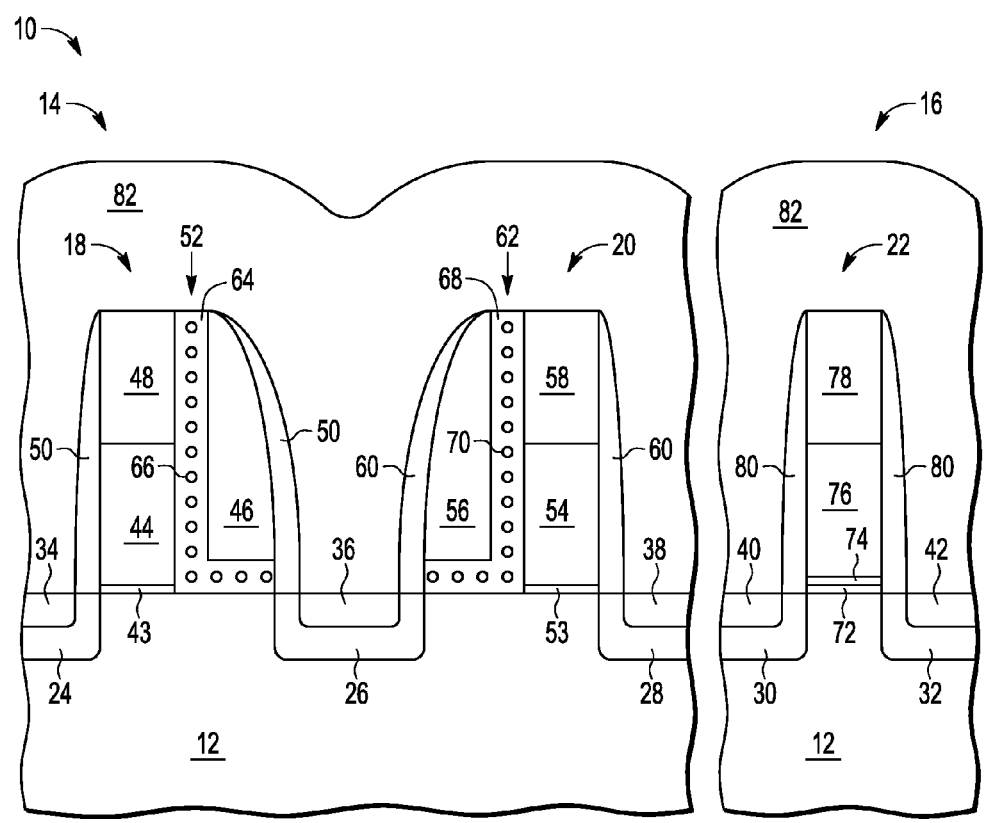
FIG. 2 is a cross section of a non-volatile memory cell and a gate last transistor of FIG. 1 at a subsequent stage in processing.

Shown in FIG. 2 is semiconductor device 10 after depositing an interlayer dielectric layer 82 over gate structures 18, 20, and 22. Interlayer dielectric layer 82 may be oxide and may be deposited in multiple layers. Interlayer dielectric layer 82 may also include dielectrics other than oxide. Interlayer dielectric layer 82 is preferably at least the height of select gates 44 and 54 and dummy gate 76.

Figure 3:
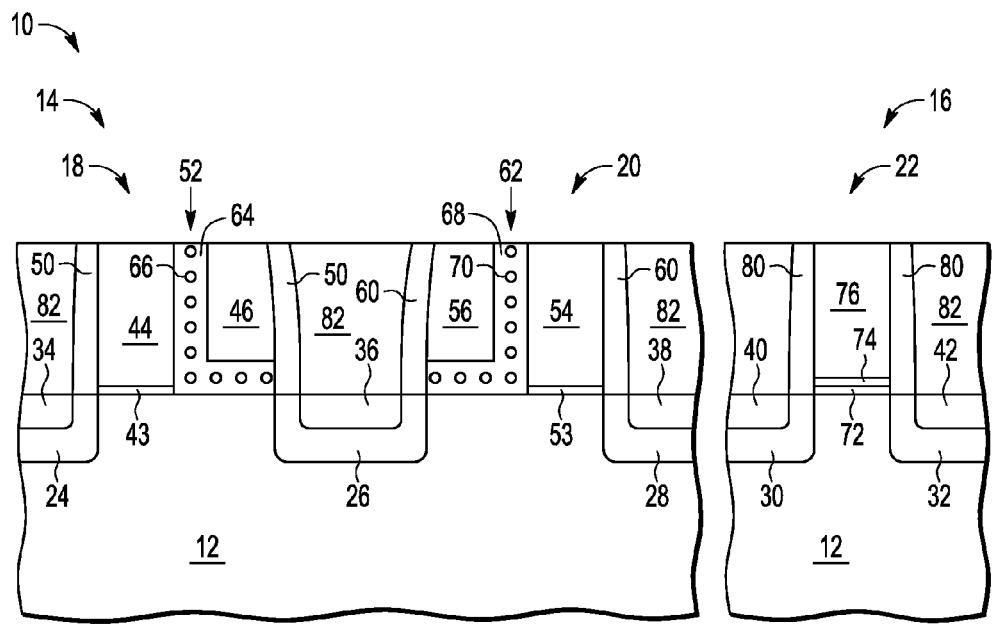
FIG. 3 is a cross section of a non-volatile memory cell and a gate last transistor of FIG. 2 at a subsequent stage in processing.

Shown in FIG. 3 is semiconductor device 10 after planarizing a top surface of semiconductor device 10 by removing cap dielectrics 48, 58, and 78 and removing top portions of select gates 44 and 54, control gates 46 and 56, and dummy gate 76. Planarizing is typically achieved by using chemical mechanical polishing (CMP).

Figure 4:
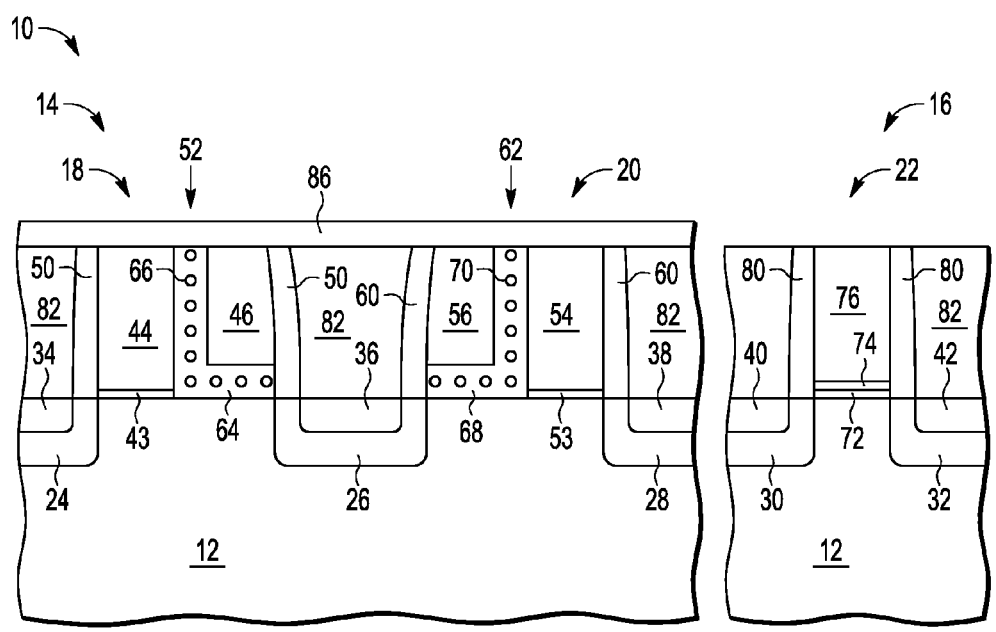
FIG. 4 is a cross section of a non-volatile memory cell and a gate last transistor of FIG. 3 at a subsequent stage in processing.

Shown in FIG. 4 is semiconductor device 10 after forming a masking layer 86 over NVM region 14 which may be a hard mask of nitride.

Figure 5:
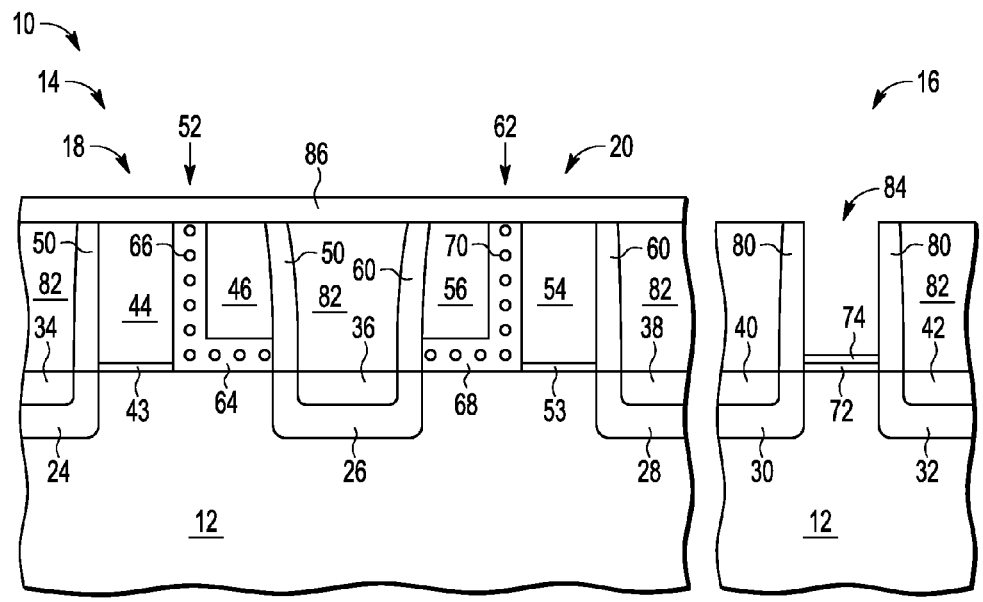
FIG. 5 is a cross section of a non-volatile memory cell and a gate last transistor of FIG. 4 at a subsequent stage in processing.

Shown in FIG. 5 is semiconductor device 10 after removing dummy gate 76 to leave an opening 84 that exposes barrier layer 74. Masking layer 86 remains over NVM region 14.

Figure 6:
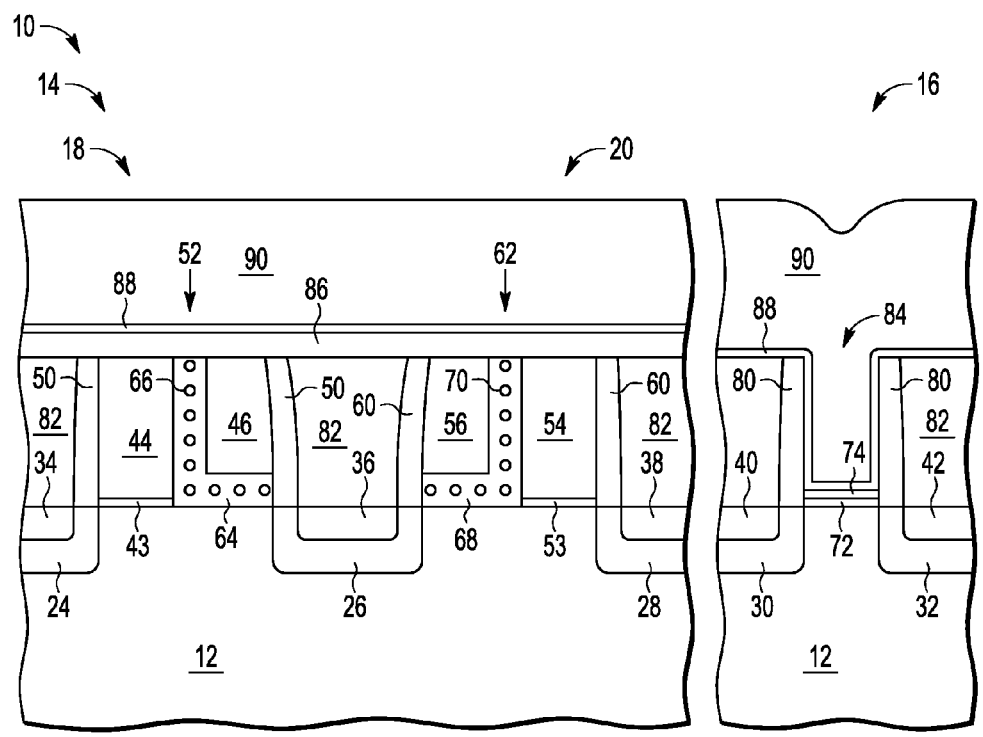
FIG. 6 is a cross section of the non-volatile memory cell and a gate last transistor of FIG. 5.

Shown in FIG. 6 is semiconductor device 10 after depositing a work function metal layer 88 and a metal gate layer 90 which results in work function metal layer 88 lining opening 84 as well as covering semiconductor device 10 and metal gate layer 90 filling opening 84 and also covering semiconductor device 10. For N channel transistors, work function metal layer 88 may be titanium aluminum nitride (TiAlxNy), and for P channel transistors, work function metal layer 88 may be titanium-rich titanium nitride (TiN). Metal gate layer 90 may be aluminum for both N and P channel transistors. Other metallic materials may also be effective such as AlO for P channel transistors LaO for N channel transistors. These and other choices may vary based on what is found to be found most effective for the intended function and for manufacturability.

Figure 7:
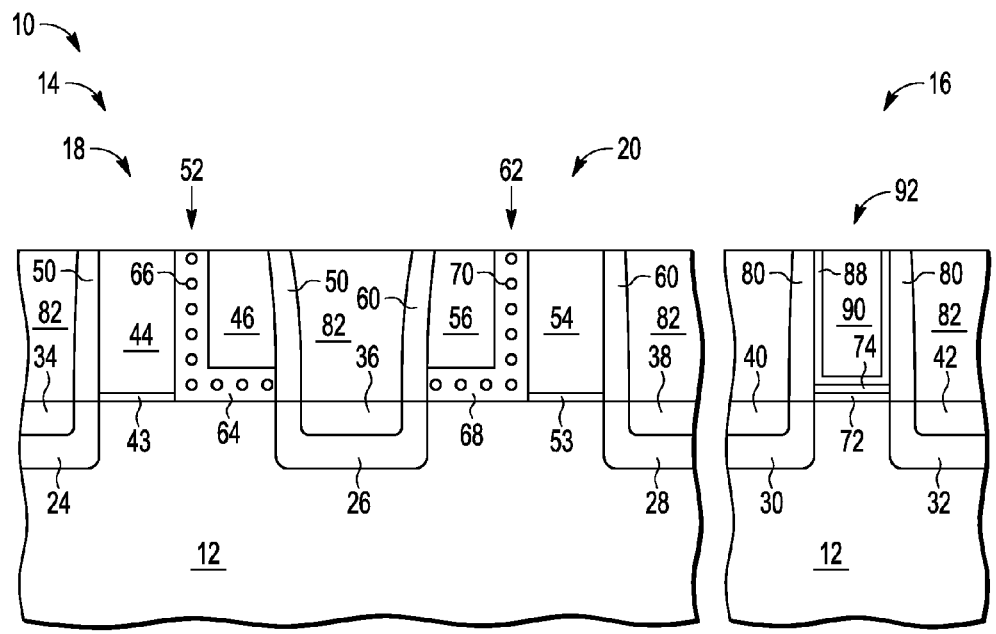
FIG. 7 is a cross section of a non-volatile memory cell and a gate last transistor of FIG. 6 at a subsequent stage in processing.

Shown in FIG. 7 is semiconductor device 10 after planarizing which may be performed by CMP which results in a logic gate 92 from metal gate layer 90, work function metal layer 88, and barrier layer 74 in opening 84. The result of this CMP, also, is potentially that some polysilicon particles may be left on the top surface of the charge storage layers such as charge storage layer 52 and charge storage layer 62. This type of particle reduces the isolation between the select gate and the control gate and has a deleterious effect on performance.

Figure 8:
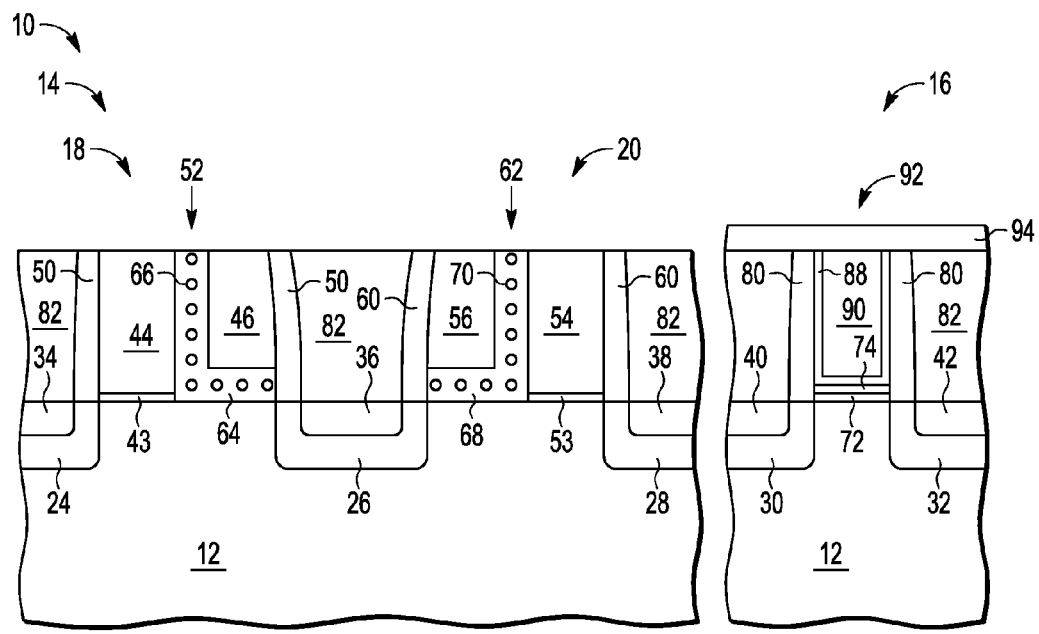
FIG. 8 is a cross section of a non-volatile memory cell and a gate last transistor of FIG. 7 at a subsequent stage in processing.

Shown in FIG. 8 is semiconductor device 10 forming a masking layer 94 over logic region 16 which may be a hard mask of nitride.

Figure 9:
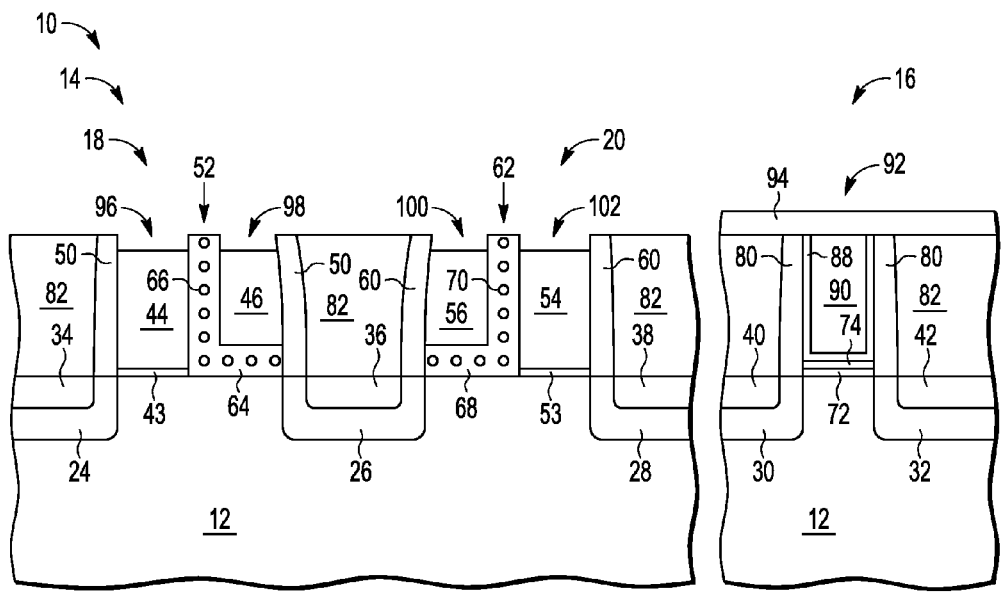
FIG. 9 is a cross section of a non-volatile memory cell and a gate last transistor of FIG. 8 at a subsequent stage in processing.

Shown in FIG. 9 is semiconductor device 10 after applying an etchant that removes polysilicon selective to oxide, which may be a wet etchant, which causes a recess 96 in select gate 44, a recess 98 in control gate 46, a recess 100 in control gate 56, and a recess 102 in select gate 54 and removal of the particles on charge storage layers 52 and 62. Both the recesses and the particle removal benefit isolation and thus performance.

Figure 10:
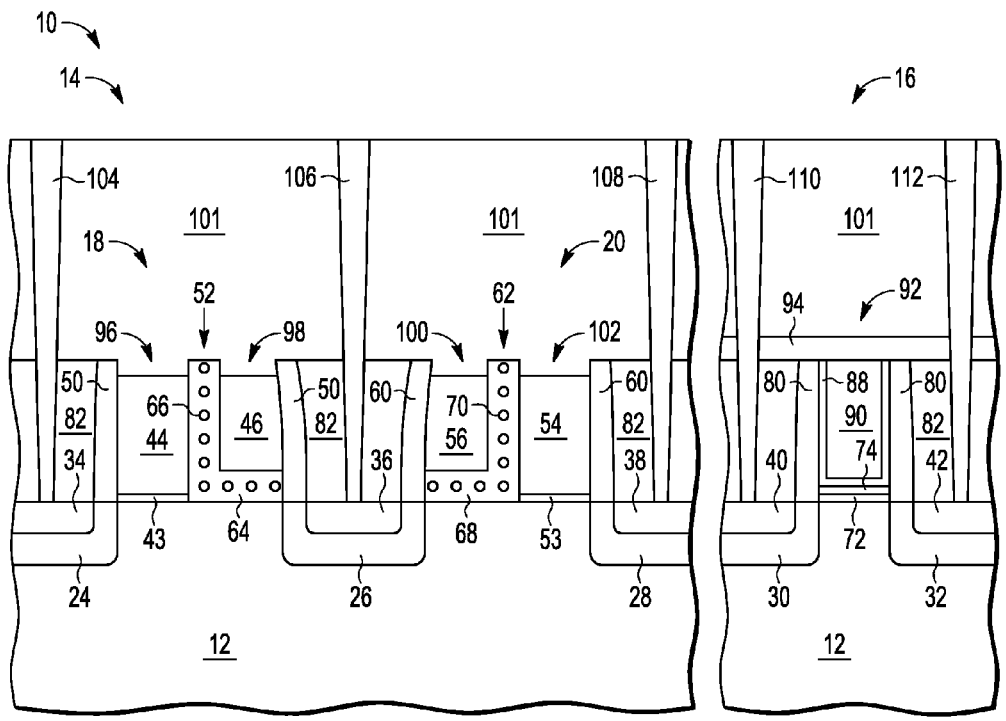
FIG. 10 is a cross section of a non-volatile memory cell and a gate last transistor of FIG. 9 at a subsequent stage in processing.

Shown in FIG. 10 is semiconductor device 10 after depositing an interlayer dielectric layer 101, a contact 104 through interlayer dielectric layer 101 and interlayer dielectric layer 82 to silicide region 34, a contact 106 through interlayer dielectric layer 101 and interlayer dielectric layer 82 to silicide region 36, a contact 108 through interlayer dielectric layer 101 and interlayer dielectric layer 82 to silicide region 38, contact 110 through interlayer dielectric layer 101, masking layer 94, and interlayer dielectric layer 82 to silicide region 40, and a contact 112 through interlayer dielectric layer 101, masking layer 94, and interlayer dielectric layer 82 to silicide region 42.

Thus, it is shown how the potential problem of a CMP step resulting in polysilicon particles that adversely impact isolation between the select gate and control gate can be removed and isolation be improved by recessing the control gate and select gate with an etch that etches polysilicon selectively to oxide.

By now it should be appreciated that there has been provided a method of making a semiconductor device. The method includes forming a memory gate structure in a nonvolatile memory region of the semiconductor device, wherein the memory gate structure comprises a first gate separated from a second gate by a charge storage layer. The method further includes forming a logic gate structure in a logic region of the semiconductor device. The method further includes forming a hard mask over at least the logic gate structure. The method further includes selectively etching the nonvolatile memory region such that a first recess is formed in the first gate and a second recess is formed in the second gate. The method may further include, prior to forming a hard mask, forming a metal gate portion of the logic gate structure. The method may have a further characterization by which the logic gate structure further comprises a high-k dielectric material. The method may further include, prior to forming the hard mask, polishing a top surface of the nonvolatile memory region and a top surface of the logic region. The method may have a further characterization by which polishing the top surfaces comprises polishing with a chemical mechanical polishing processes. The method may have a further characterization by which the charge storage layer comprises a plurality of nanocrystals. The method may have a further characterization by which selective etching the nonvolatile memory region comprises using a wet etch selective to a material from which the first and second gates are formed. The method may have a further characterization by which the logic gate structure is substantially the same height as the memory gate structure. The method may have a further characterization by which the logic gate structure is formed of substantially the same materials in substantially the same ratios as the memory gate structure. The method may further include forming a polish fill layer over the nonvolatile memory region and the logic region, patterning the polish fill layer, and forming a plurality of contacts to a corresponding plurality of contact pads in the nonvolatile memory region and the logic region. The method may have a further characterization by which at least one of the plurality of contact pads comprises a silicided portion of a source/drain region.

Also disclosed is a method of making a semiconductor device. The method includes forming a memory gate structure in a nonvolatile memory region of the semiconductor device, wherein the memory gate structure comprises a first gate structure separated from a second gate structure by a charge storage layer, wherein the first gate structure comprises an electrode portion and a dielectric portion. The method further includes forming a logic gate structure in a logic region of the semiconductor device, wherein the logic gate structure comprises a first dummy portion and a second dummy portion, wherein the logic gate structure is substantially the same height as the first gate structure. The method further includes selectively polishing the nonvolatile memory region and the logic region such that the dielectric portion and the second dummy portion are substantially removed. The method further includes replacing the first dummy portion with a metal gate material. The method further includes forming a hard mask over at least the logic gate structure comprising the metal gate material. The method further includes selectively etching the nonvolatile memory region such that a first recess is formed in the first gate structure and a second recess is formed in the second gate structure. The method may have a further characterization by which the logic gate structure further comprises a high-k dielectric material. The method may have a further characterization by which selectively polishing comprises polishing with a chemical mechanical polishing processes. The method may have a further characterization by which selective etching the nonvolatile memory region comprises using a wet etch selective to a material from which the first and second gate structures are formed. The method may further include forming a plurality of contacts to a corresponding plurality of contact pads in the nonvolatile memory region and the logic region forming a plurality of contacts to a corresponding plurality of contact pads in the nonvolatile memory region and the logic region.

Disclosed also is a semiconductor device. The semiconductor device includes a metal gate including a sidewall portion, a work function metal layer over the sidewall portion, and a metal electrode portion over the work function metal layer. The semiconductor device further includes a first nonvolatile memory gate comprising a first top portion. The semiconductor device further includes a second nonvolatile memory gate comprising a second top portion, the second nonvolatile memory gate separated from the first nonvolatile memory gate by a charge storage layer, wherein the first nonvolatile memory gate comprises a first recess in the first top portion and the second nonvolatile memory gate comprises a second recess in the second top portion. The semiconductor device may have a further characterization by which the metal gate further comprises a high-k dielectric material. The semiconductor device may have a further characterization by which the metal gate further comprises at least a portion of a hard mask layer over the sidewall portion. The semiconductor device may have a further characterization by which the metal gate further comprises a barrier metal layer.

Although the invention is described herein with reference to specific embodiments, various modifications and changes can be made without departing from the scope of the present invention as set forth in the claims below. For example, other combinations of materials for the various purposes of conductivity, dielectric properties, and replaced materials that those described may be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor device, the method comprising:
   forming a memory gate structure in a nonvolatile memory region of the semiconductor device, wherein the memory gate structure comprises a first gate separated from a second gate by a charge storage layer;
   forming a logic gate structure in a logic region of the semiconductor device;
   forming a hard mask over at least the logic gate structure; and
   selectively etching the nonvolatile memory region such that a first recess is formed in the first gate and a second recess is formed in the second gate.

2. The method of claim 1, further comprising: prior to forming a hard mask, forming a metal gate portion of the logic gate structure.

3. The method of claim 2, wherein the logic gate structure further comprises a high-k dielectric material.

4. The method of claim 1, further comprising: prior to forming the hard mask, polishing a top surface of the nonvolatile memory region and a top surface of the logic region.

5. The method of claim 4, wherein polishing the top surfaces comprises polishing with a chemical mechanical polishing processes.

6. The method of claim 1, wherein the charge storage layer comprises a plurality of nanocrystals.

7. The method of claim 1, wherein selective etching the nonvolatile memory region comprises using a wet etch selective to a material from which the first and second gates are formed.

8. The method of claim 1, wherein the logic gate structure is substantially the same height as the memory gate structure.

9. The method of claim 8, wherein the logic gate structure is formed of substantially the same materials in substantially the same ratios as the memory gate structure.

10. The method of claim 1, further comprising:
    forming a polish fill layer over the nonvolatile memory region and the logic region;
    patterning the polish fill layer; and
    forming a plurality of contacts to a corresponding plurality of contact pads in the nonvolatile memory region and the logic region.

11. The method of claim 10, wherein at least one of the plurality of contact pads comprises a silicided portion of a source/drain region.

12. A method of making a semiconductor device, the method comprising:
    forming a memory gate structure in a nonvolatile memory region of the semiconductor device, wherein the memory gate structure comprises a first gate structure separated from a second gate structure by a charge storage layer, wherein the first gate structure comprises an electrode portion and a dielectric portion;

forming a logic gate structure in a logic region of the semiconductor device, wherein the logic gate structure comprises a first dummy portion and a second dummy portion, wherein the logic gate structure is substantially the same height as the first gate structure;

selectively polishing the nonvolatile memory region and the logic region such that the dielectric portion and the second dummy portion are substantially removed;

replacing the first dummy portion with a metal gate material;

forming a hard mask over at least the logic gate structure comprising the metal gate material; and selectively etching the nonvolatile memory region such that a first recess is formed in the first gate structure and a second recess is formed in the second gate structure.

13. The method of claim 12, wherein the logic gate structure further comprises a high-k dielectric material.

14. The method of claim 12, wherein selectively polishing comprises polishing with a chemical mechanical polishing processes.

15. The method of claim 12, wherein selective etching the nonvolatile memory region comprises using a wet etch selective to a material from which the first and second gate structures are formed.

16. The method of claim 12, further comprising:
    forming a polish fill layer over the nonvolatile memory region and the logic region;
    patterning the polish fill layer; and
    forming a plurality of contacts to a corresponding plurality of contact pads in the nonvolatile memory region and the logic region.

* * * * *